United States Patent
Jensen et al.

(10) Patent No.: US 6,639,530 B2
(45) Date of Patent: Oct. 28, 2003

(54) MODULATION OF AN ANALOG SIGNAL INTO A DIGITAL REPRESENTATION THEREOF

(75) Inventors: Henrik Jensen, Long Beach, CA (US); Brima Ibrahim, Los Angeles, CA (US)

(73) Assignee: Broadcom, CORP, Irvine, CA (US)

( * ) Notice: Subject to any disclaimer, the term of this patent is extended or adjusted under 35 U.S.C. 154(b) by 0 days.

(21) Appl. No.: 09/993,831

(22) Filed: Nov. 6, 2001

(65) Prior Publication Data

US 2003/0085825 A1 May 8, 2003

(51) Int. Cl.[7] .............................................. H03M 3/00
(52) U.S. Cl. ...................................... 341/143; 341/144
(58) Field of Search ................................. 341/143, 144, 341/120

(56) References Cited

U.S. PATENT DOCUMENTS 5,305,004 A * 4/1994 Fattaruso .................... 341/120
5,442,353 A * 8/1995 Jackson ...................... 341/143
5,870,048 A * 2/1999 Kuo et al. ................... 341/143
6,346,898 B1 * 2/2002 Melanson .................... 341/143

* cited by examiner

Primary Examiner—Peguy JeanPierre
Assistant Examiner—Joseph Lauture
(74) Attorney, Agent, or Firm—Timothy W. Markison (57) ABSTRACT

A method and apparatus for modulating a signal into a digital representation thereof includes processing that begins by integrating a difference between an input signal and an analog feedback signal to produce an integrated signal. The processing then continues by quantizing the integrated signal to produce a quantized signal. The processing continues by generating a spectral shaping signal to compensate for non-linearities of the analog feedback signal. The processing further continues by injecting the spectral shaping signal into the quantized signal to produce a spectrally adjusted quantized signal. The processing further continues by converting the spectrally adjusted quantized signal into the analog feedback signal.

15 Claims, 4 Drawing Sheets

FIG. 1
sigma-delta modulator 10

MODULATION OF AN ANALOG SIGNAL INTO A DIGITAL REPRESENTATION THEREOF

TECHNICAL FIELD OF THE INVENTION

This invention relates generally to mixed signal processing and more particularly to Delta Sigma modulators.

BACKGROUND OF THE INVENTION

As is known, Delta Sigma modulators are used in a variety of applications that may be constructed in a variety of ways. For example, a Delta Sigma modulator may be used in analog to digital converters, digital to analog converters, local oscillators, et cetera. The construction may be $1^{st}$ order, multi-order (typically 2 to 8), mash configuration, single-bit output and/or multi-bit output.

In general, a Delta Sigma modulator includes an integration section and a quantizer. The integration section samples an input signal (e.g., analog or digital) at an over sampling rate (e.g., 8 to 256 times the Nyquist rate) and then integrates the samples based on the order of integration (i.e., the number of integrators). The integrated signals are then quantized by the quantizer at the over sampling rate. The resulting quantized signal is a digital representation of the input signal.

The digital representation of the input signal may be filtered via a decimation filter to produce a digital value for analog to digital conversion. Alternatively, the digital representation of the input signal may be low pass filtered to produce an analog signal for digital to analog conversion.

As is further known, when the quantizer produces a multi-bit output, the quantization noise is reduced with respect to a single-bit quantized output. However, a multi-bit Delta Sigma modulator requires a multi-bit feedback path that includes one or more digital to analog converters (the number depends on the order of the Delta Sigma modulator) to provide an analog representation of the quantized signal to the integration section. Since an ideal multi-bit DAC does not exist, non-linearities are introduced into the Delta Sigma modulator via the feedback digital to analog converter(s). Such non-linearities adversely affect the performance of the Delta Sigma modulator by degrading dynamic range and signal to noise ratio.

Therefore, a need exists for a compensation method and apparatus that minimizes the adverse affects of non-linearities introduced by feedback DACs (digital to analog converters) in a Delta Sigma modulator.

DETAILED DESCRIPTION OF A PREFERRED EMBODIMENT

Generally, the present invention provides a method and apparatus for modulating a signal into a digital representation thereof. Such a method and apparatus includes processing that begins by integrating a difference between an input signal and an analog feedback signal to produce an integrated signal. The processing then continues by quantizing the integrated signal to produce a quantized signal. The quantized signal corresponds to the digital representation of the input signal. The processing continues by generating a spectral shaping signal to compensate for non-linearities of the analog feedback signal. The processing further continues by injecting the spectral shaping signal into the quantized signal to produce a spectrally adjusted quantized signal. The processing further continues by converting the spectrally adjusted quantized signal into the analog feedback signal. With such a method and apparatus, non-linearities introduced by a feedback path that includes digital to analog converters within a Delta Sigma modulator can be mitigated, thus substantially reducing the adverse affects caused by such non-linearities.

Figure 1:
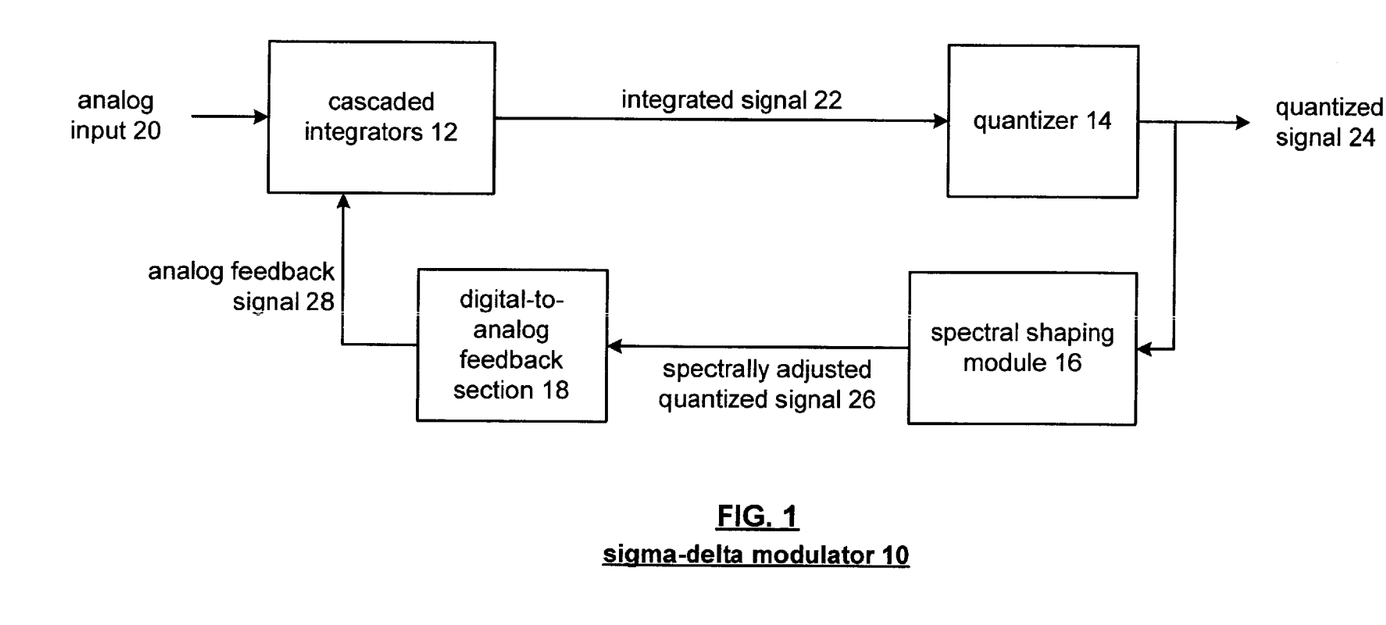
FIG. 1 illustrates a schematic block diagram of a Delta Sigma modulator in accordance with the present invention.

The present invention can be more fully described with reference to FIGS. 1 through 7. FIG. 1 illustrates a schematic block diagram of a Delta Sigma modulator 10 that includes cascaded integrators 12, quantizer 14, spectral shaping module 16, and a digital to analog feedback section 18. The cascaded integrators 12, which will be discussed in greater detail with reference to FIG. 2, receive an analog input 20 and an analog feedback signal 28. Based on these inputs, the cascaded integrator 12 produces an integrated signal 22.

The quantizer 14, which will be described in greater detail with reference to FIG. 2, quantizes the integrated signal 22 to produce a quantized signal 24. The spectral shaping module 16 which will be described in greater detail with reference to FIGS. 2 through 4, processes the quantized signal 24 to produce a spectrally adjusted quantized signal 26. The digital to analog feedback section 18, which will be described in greater detail with reference to FIG. 2, converts the spectrally adjusted quantized signal 26 into the analog feedback signal 28.

In this configuration, the spectral shaping module 16 modulates the non-linearities produced by the digital to analog feedback section 18 to spectrally adjust the quantized signal 24 to substantially reduce the adverse affects caused by the non-linearities within the digital to analog feedback section 18.

Figure 2:
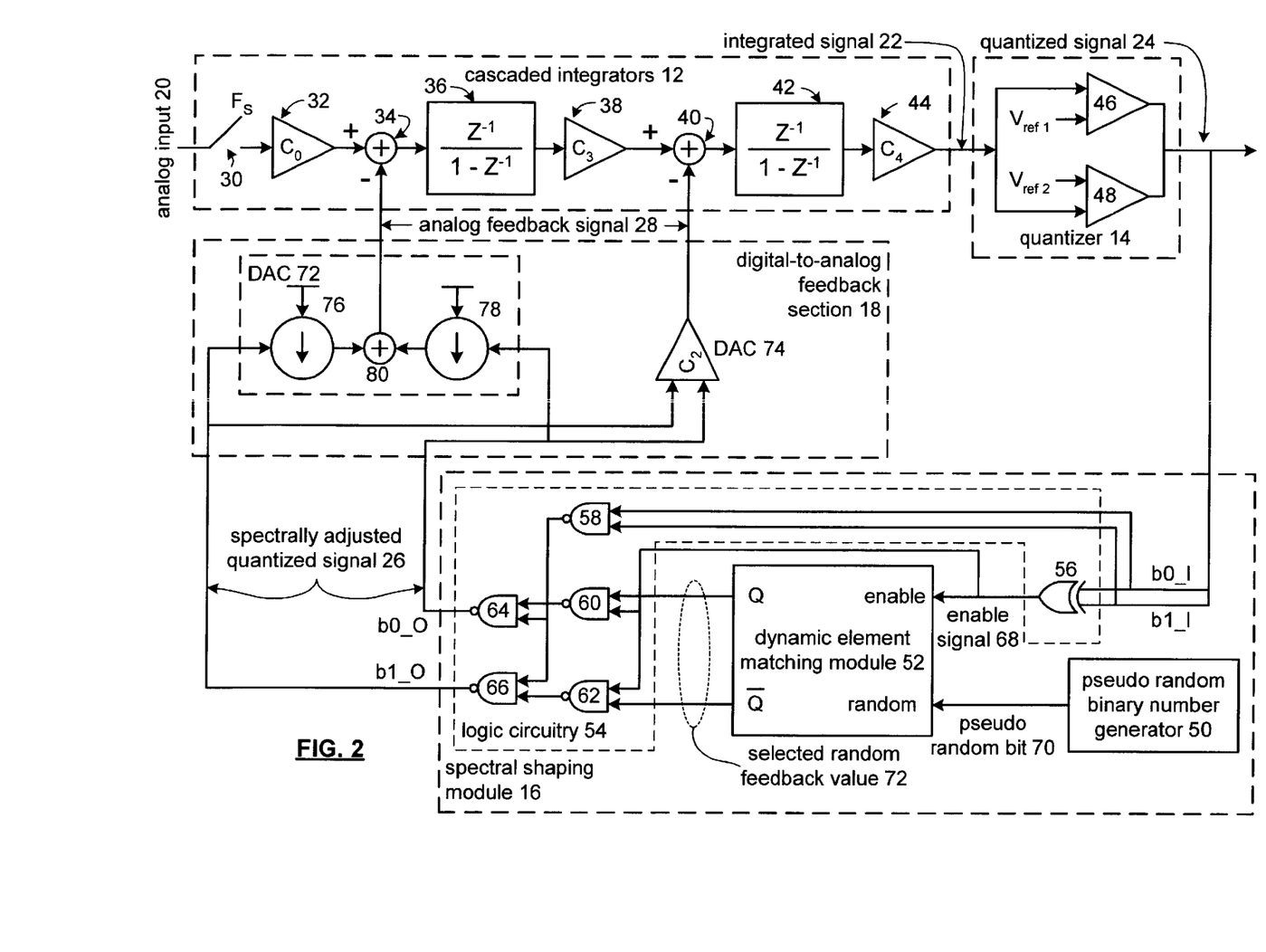
FIG. 2 illustrates a more detailed schematic block diagram of a Delta Sigma modulator in accordance with the present invention.

FIG. 2 illustrates a more detailed schematic block diagram of the Delta Sigma modulator 10. As shown, the Delta Sigma modulator 10 includes the cascaded integrators 12, the quantizer 14, the spectral shaping module 16 and the digital to analog feedback section 18. In this example, the Delta Sigma modulator is a $2^{nd}$ order Delta Sigma modulator. As one of average skill in the art will appreciate, the Delta Sigma modulator, however, may be a $1^{st}$ order, or other higher order Delta Sigma modulator, may include a mash topology or portion thereof, or any other known configurations of Delta Sigma modulators.

The cascaded integrators 12 include 2 integration sections and a sampling device 30, which may be switched capacitors switched at the oversampling rate. The $1^{st}$ integration section includes buffer 32 that introduces a coefficient $C_0$, a summing module 34, an integrator 36, and a $2^{nd}$ buffer 38 that introduces coefficient $C_3$. The $2^{nd}$ integration section includes the summation module 40, a $2^{nd}$ integrator 42, and a $3^{rd}$ buffer 44 that introduces coefficient $C_4$. In this configuration, the sampling circuitry 30 samples the analog input 20 at the over sampling rate ($F_s$). The $1^{st}$ summing module 34 receives an analog feedback signal 28 from a $1^{st}$ digital to analog conversion section of the digital to analog feedback section 18. The $2^{nd}$ summing module 40 receives an analog feedback signal from a $2^{nd}$ digital to analog converter 74 of the digital to analog feedback section 18. The $1^{st}$ digital to analog converter 72 provides another coefficient ($C_1$) while the second digital to analog converted 74 provides coefficient ($C_2$). The magnitudes of coefficients $C_0$ through $C_4$ depend on the desired maximum signal amplitudes at the integrator outputs and the quantizer input, which, in turn, depends on circuitry design details and choice of circuit process technology.

The quantizer 14 includes 2 comparators 46 and 48 to produce a 3-level quantized signal 24. Accordingly, the quantizer 14 compares the integrated signal 22 with two reference voltages ($V_{ref1}$, $V_{ref2}$) via the comparators 46 and 48 to produce the 3-level quantized signal.

The spectral shaping module 16 includes a pseudo random binary number generation 50, a dynamic element matching module 52 and logic circuitry 54. The pseudo random binary number generation 50 is operably coupled to produce a pseudo random bit 70, which is provided to the dynamic element matching module 52. The logic circuitry 54 includes a plurality of NAND gates 58–66 and an exclusive OR gate 56. The exclusive OR gate is operably coupled to receive the 2-bit quantized signal 24 and produce an enable signal 68 therefrom.

The dynamic element matching module 52, which will be described in greater detail with reference to FIG. 4, receives the enable signal 68 and the pseudo random bit 70. Based on these inputs, the dynamic element matching module 52 produces a selected random feedback value 72, which causes harmonic distortion and/or mismatch noise of the feedback DACs to fall primarily outside the signal band. The logic circuitry 54 processes the selected random feedback value 72 and the 2 bits of the quantized signal 24 to produce 2 bits of a spectrally adjusted quantized signal 26.

The 2 bits of the spectrally adjusted quantized signal 26 are provided to each of the digital to analog converters 72 and 74 of the digital to analog feedback section 18.

Digital to analog converter 72 is shown to include a $1^{st}$ current source 76, a $2^{nd}$ current source 78 and a summing module 80. The details of digital to analog converter 74 are similar to digital to analog converter 72 and operate in a similar manner. In this configuration, the current source 76 receives bit 1 of the output of the spectral shaping module 16 and current source 78 receives bit 0 of the output of the spectral shaping module 16. If bit 0 and bit 1 of the spectrally adjusted quantized signal 26 are both 0, the current sources 76 and 78 provide no current, thus, the analog feedback signal produced by digital to analog converter 72 is 0. If bit 0 is 1 and bit 1 is 0, then current source 78 is on and current source 76 is off. This produces a ½ current signal to the summing module 34. If both bits are on, then both current sources 76 and 78 are active, thus, the current provided to the summing module 34 is the sum of currents produced by current sources 76 and 78.

In general, while current sources 76 and 78 are implemented using matching transistors, matching layouts, and have substantially similar components, the current sources 76 and 78 do not produce exactly the same current. The mismatch in generated currents produces the non-linearities (e.g., harmonic distortion and/or mismatch noise) within the digital to analog converter 72. For example, when ½ current is to be supplied (i.e., only 1 of the current sources 76 or 78 is active), and one current source is continually selected to provide the current, non-linearities will result since the current provided by the selected current source is not exactly equal to ½ the sum of the current provided by both current sources.

The spectral shaping module 16 produces the spectrally adjusted quantized signal 26 to avoid the non-linearities by randomly selecting one of the current sources 76 or 78 to provide the ½ current when ½ current is required. The next time ½ current is required, the spectral shaping module 76 causes the other current source to provide the ½ current. For example, the spectral shaping module may indicate on a random basis that current source 76 is to provide the current when ½ current is needed. The next time ½ current is needed for the feedback signal, the spectral shaping module 16 insures that current source 78 provides the current. The next time ½ current is to be provided as the feedback signal, the spectral shaping module 16 randomly chooses either current source 76 or 78 based on the pseudo random bit 70. However, once one current source is randomly selected, the next time ½ current is needed for the feedback signal, the other current source is used. As such, the non-linearities introduced by the differences between current source 76 and 78 is substantially eliminated, thus, substantially eliminating the non-lineariries caused by the feedback digital to analog converters 72 and 74.

Figures 3, 4:
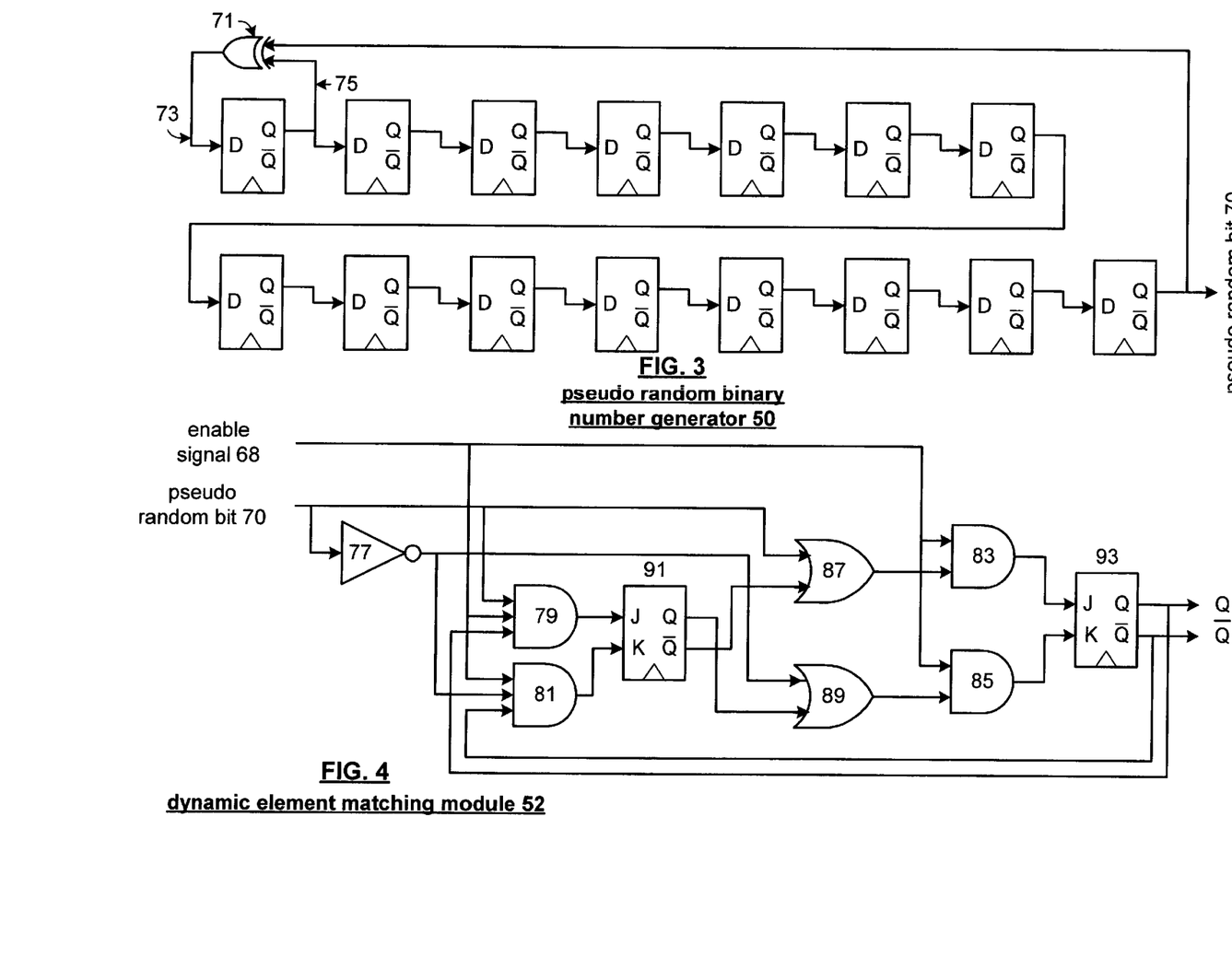
FIG. 3 illustrates a schematic block diagram of a pseudo random binary number generator of the Delta Sigma modulator of FIG. 2.
FIG. 4 illustrates a schematic block diagram of a dynamic element matching module of the Delta Sigma modulator of FIG. 2.

FIG. 3 illustrates a schematic block diagram of the pseudo random binary number generation 50 that includes an exclusive OR gate 71 and a plurality of daisy chain flip-flops. The exclusive OR gate is operably coupled to produce a reference bit 73 from the pseudo random bit 70 and a feedback bit 75 and to provide the reference bit 73 to the plurality of daisy chain flip-flops. The plurality of daisy chain flip-flops, which are shown as D flip-flops, are clocked based on the over sampling clock rate, a multiple thereof or a fraction thereof, to produce the feedback bit 75 and the pseudo random bit 70 based on the reference bit 73. As one of average skill in the art will appreciate, the feedback bit 75 may come from any one of the D flip-flops in the daisy chain.

FIG. 4 illustrates a schematic block diagram of the dynamic element matching module 52 that includes sequential logic and switching logic that collectively include inverter 77, AND gates 79, 81, 83, 85, OR gates 87, 89, and J–K flip-flops 91, 93. The sequential logic is operably coupled to generate a sequentially subsequent select random feedback value from the selected random feedback value. The switching logic is operably coupled to switch between the selected random feedback value and the sequentially subsequent selected random feedback value.

In general, the circuitry of the dynamic element matching module 52 is operably coupled to either utilize the selected random bit 70 to choose the current source 76 or current source 78 in the DAC when the dynamic element matching module 52 indicates that a random choice is to be made. Once a random choice is made, the dynamic element matching module 52 selects the other current source for the next time ½ current is to be provided as the feedback signal. Having made the random selection and the dependent or subsequent selection, the dynamic element matching module 52 again utilizes the pseudo random bit 70 to select a current source. The next selection, however, is the opposite one indicated by the pseudo random bit. As such, the dynamic element matching module 52 makes a random selection every other selection of a current source. Following every random select-on of a current source, the other current source is selected.

Figure 5:
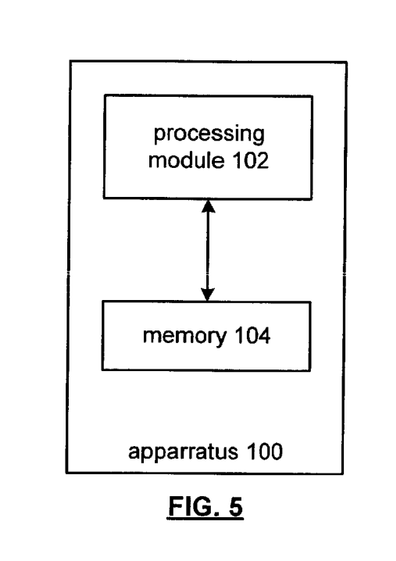
FIG. 5 illustrates a logic diagram of an alternate Delta Sigma modulating apparatus in accordance with the present invention.

FIG. 5 illustrates a schematic block diagram of an apparatus 100 for modulating a signal into a digital representation thereof. Tile apparatus 100 includes a processing module 102 and memory 104. The processing module 102 may be a single processing device or a plurality of processing devices. Such a processing device may be a microcontroller, microcomputer, microprocessor, digital signal processor, field programmable gate array, programmable logic device, state machine, logic circuitry, and/or any device that manipulates signals (analog and/or digital) based on operational instructions. The memory 104 may be a single memory device or a plurality of memory devices. Such a memory device may be read-only memory, random access memory, volatile memory, non-volatile memory, dynamic memory, static memory, flash memory, and/or any device that stores digital information. Note that when the processing module 102 implements one or more of its functions via a state machine or logic circuitry, the memory storing the corresponding operational instruction is embedded within the circuitry comprising the state machine or logic circuit. The operational instructions stored in memory 104 and executed by processing module 102 are generally depicted in the logic diagram of FIGS. 6 and 7.

Figure 6:
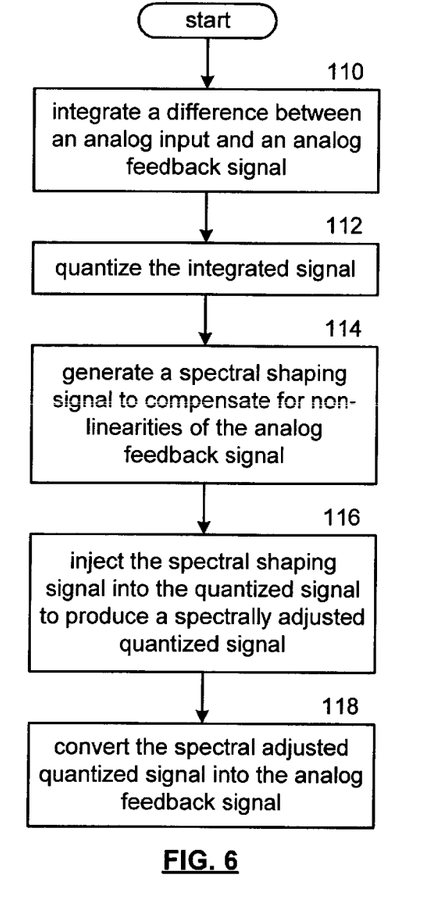
FIGS. 6 and 7 illustrate a logic diagram of a method for modulating an analog signal into a digital representation in accordance with the present invention.

FIG. 6 illustrates a logic diagram of a method for modulating a signal into a digital representation thereof. The process begins at Step 110 where a difference between an analog input signal and an analog feedback signal to produce an integrated signal. The process then proceeds to Step 112 where the integrated signal is quantized to produce a quantized signal, which is a digital representation of the analog input signal. The quantization may be done by comparing the integrated signal with two reference levels to produce a 3-level quantized signal.

The process then proceeds to Step 114 where a spectral shaping signal is generated to compensate for non-linearities of the analog feedback signal. The process then proceeds to Step 116 where the spectral shaping signal is injected into the quantized signal to produce a spectrally adjusted quantized signal. The process then proceeds to Step 118 where the spectrally adjusted quantized signal is converted into the analog feedback signal.

Figure 7:
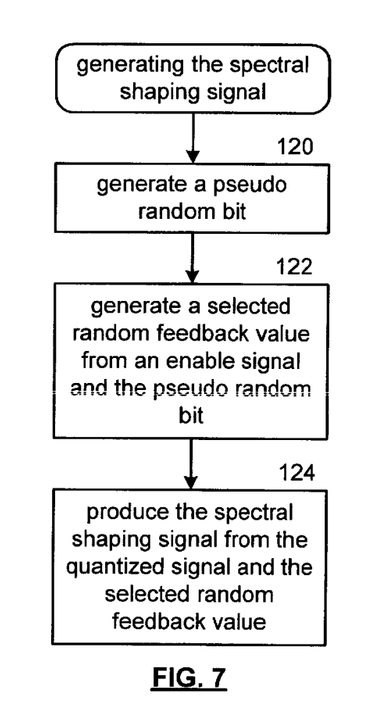

The generation of the spectral shaping signal may be further described with reference to the logic diagram of FIG. 7. The processing begins at Step 120 where a pseudo random bit is generated. This may be done by exclusive ORing the pseudo random bit and a feedback bit to produce a reference bit. The reference bit may then be processed via a daisy chain of flip-flops to produce the feedback bit and the pseudo random bit.

The process then proceeds to Step 122 where a selected random feedback value is generated from an enable signal and the pseudo random bit. This may be done by generating a sequentially subsequent selected random feedback value from the selected random feedback value and switching between the selected random feedback value and the sequentially subsequent selected random feedback value. This was described in greater detail with reference to FIG. 4.

The process then proceeds to Step 124 where the spectral shaping signal is produced from the quantized signal and the selected random feedback value. This again was further described with reference to FIG. 4.

The preceding discussion has presented a method and apparatus for modulating an input signal into a digital representation thereof. Such a scheme may be utilized in Delta Sigma modulators to substantially reduce non-linearities introduced by digital to analog converters within a feedback path. As one of average skill in the art will appreciate, other embodiments may be derived from the teaching of the present invention, without deviating from the scope of the claims.

What is claimed is:

1. A Delta Sigma modulator comprises:

cascaded integrators operably coupled to integrate a difference between an analog input and an analog feedback signal to produce an integrated signal;

quantizer operably coupled to quantize the integrated signal to produce a three-level quantized signal;

spectral shaping module operably coupled to receive the quantized signal, wherein the spectral shaping module produces a spectrally adjusted quantized signal having:
a first logic value when the three-level quantized signal is at a first level,
a second logic value or a third logic value when the three-level quantized signal is at a second level, wherein the second logic value or the third logic value is determined in accordance with a random selection pattern, and
a fourth logic value when the three-level quantized signal is at a third level; and the digital-to-analog feedback section including at least one digital-to-analog converter that includes two current sources that produce the analog feedback signal in one of three states based on the spectrally adjusted quantized signal, wherein the at least one digital-to-analog converter produces:
a first state of the three states by disabling both of the two currents sources when the spectrally adjusted quantized signal is the first logic value,
a second state of the three states by enabling one of the two current sources and disabling another of the two current sources when the spectrally adjusted quantized signal is the second logic value,
or enabling the another of the two current sources and disabling the one of the two current sources when the spectrally adjusted quantized signal is the third logic value, and
a third state of the three states by enabling both of the two current sources when the spectrally adjusted quantized signal is the fourth logic value.

2. The Delta Sigma modulator of claim 1, wherein the quantizer further comprises:

pair of comparators operably coupled to produce the three- level quantized signal.

3. The Delta Sigma modulater of claim 2, wherein the spectral shaping module further comprises:

pseudo random binary number generation operably coupled to generate a pseudo random bit;

dynamic element matching module operably coupled to receive an enable signal and the pseudo random bit, wherein the dynamic element matching module generates a selected random feedback value from the enable signal and the selected random bit; and logic circuitry operably coupled to produce the spectrally adjusted quantized signal from the quantized signal and the selected random feedback value.

4. The Delta Sigma modulator of claim 3, wherein the pseudo random binary number generation further comprises:
exclusive OR gate operably coupled to produce a reference bit from the pseudo random bit and a feedback bit; and
plurality of daisy-chained flip-flops operably coupled to produce the feedback bit and the pseudo random bit based on the reference bit.

5. The Delta Sigma modulator of claim 3, wherein the dynamic element matching module further comprises:
sequential logic operable to generate a sequentially subsequent selected random feedback value from the selected random feedback value; and
switching logic operably coupled to switch between the selected random feedback value and the sequentially subsequent selected random feedback value.

6. A method for modulating an analog signal into a digital signal, the method comprises:
integrating a difference between an analog input and an analog feedback signal to produce an integrated signal;
quantizing the integrated signal to produce a three-level quantized signal, wherein the three-level quantized signal is representative of the digital signal;
generating a spectral shaping signal to compensate for non-linearities of the analog feedback signal;
injecting the spectral shaping signal into the quantized signal to produce a spectrally adjusted quantized signal, wherein the spectrally adjusted quantized signal has:
a first logic value when the three-level quantized signal is at a first level,
a second logic value or a third logic value when the three-level quantized signal is at a second level, wherein the second logic value or the third logic value is determined in accordance with a random selection pattern as indicated by the spectral shaping signal, and
a fourth logic value when the three-level quantized signal is at a third level; and
converting the spectral adjusted quantized signal into the analog feedback signal, wherein the analog feedback signal is one of three states, wherein the analog feedback signal is in:
a first state of the three states when the spectrally adjusted quantized signal is the first logic value,
a first representation of a second state of the three states when the spectrally adjusted quantized signal is the second logic value,
a second representation of the second state of the three states when the spectrally adjusted quantized signal is the third logic value, and a third state of the three states when the spectrally adjusted quantized signal is the fourth logic value.

7. The method of claim 6, wherein the quantizing the integrated signal further comprises:
comparing the integrated signal with two reference levels to produce the threelevel quantized signal.

8. The method of claim 6, wherein the generating the spectral shaping signal further comprises:
generating a pseudo random bit;
generating a selected random feedback value from an enable signal and the pseudo random bit; and
producing the spectral shaping signal from the quantized signal and the selected random feedback value.

9. The method of claim 8, wherein the generating the pseudo random number further comprises:
exclusive ORing the pseudo random bit and a feedback bit to produce a reference bit; and
daisy-chained flip-flopping the reference bit to produce the feedback bit and the pseudo random bit.

10. The method of claim 8, wherein the generating the selected random feedback value further comprises:
generating a sequentially subsequent selected random feedback value from the selected random feedback value; and
switching between the selected random feedback value and the sequentially subsequent selected random feedback value.

11. An apparatus for modulating an analog signal into a digital signal, the apparatus comprises:
processing module: and
memory operably coupled to the processing module, wherein the memory includes operational instructions that cause the processing module to:
integrate a difference between an analog input and an analog feedback signal to produce an integrated signal;
quantize the integrated signal to produce a three-level quantized signal, wherein the three-level quantized signal is representative of the digital signal;
generate a spectral shaping signal to compensate for non-linearities of the analog feedback signal;
inject the spectral shaping signal into the quantized signal to produce a spectrally adjusted quantized signal, wherein the spectrally adjusted quantized signal has:
a first logic value when the three-level quantized signal is at a first level,
a second logic value or a third logic value when the threelevel quantized signal is at a second level, wherein the second logic value or the third logic value is determined in accordance with a random selection pattern as indicated by the spectral shaping signal, and
a fourth logic value when the three-level quantized signal is at a third level; and
convert the spectral adjusted quantized signal into the analog feedback signal, wherein the analog feedback signal is one of three states, wherein the analog feedback signal is in:
a first state of the three states when the spectrally adjusted quantized signal is the first logic value,
a first representation of a second state of the three states when the spectrally adjusted quantized signal is the second logic value,
a second representation of the second state of the three states when the spectrally adjusted quantized signal is the third logic value, and a third state of the three states when the spectrally adjusted quantized signal is the fourth logic value.

12. The apparatus of claim 11, wherein the memory further comprises operational instructions that cause the processing module to quantize the integrated signal by:
comparing the integrated circuit with two reference levels to produce the three-level quantized signal.

13. The apparatus of claim 11, wherein the memory further comprises operational instructions that cause the processing module to generate the spectral shaping signal by:

generating a pseudo random bit;

generating a selected random feedback value from an enable signal and the pseudo random bit; and producing the spectral shaping signal from the quantized signal and the selected random feedback value.

14. The apparatus of claim 13, wherein the memory further comprises operational instructions that cause the processing module to generate the pseudo random number by:

exclusive ORing the pseudo random bit and a feedback bit to produce a reference bit; and daisy-chained flip-flopping the reference bit to produce the feedback bit and the pseudo random bit.

15. The apparatus of claim 13, wherein the memory further comprises operational instructions that cause the processing module to generate the selected random feedback value by:

generating a sequentially subsequent selected random feedback value from the selected random feedback value; and switching between the selected random feedback value and the sequentially subsequent selected random feedback value.

* * * * *

UNITED STATES PATENT AND TRADEMARK OFFICE
CERTIFICATE OF CORRECTION

PATENT NO.       : 6,639,530 B2                                   Page 1 of 1
APPLICATION NO.  : 09/993831
DATED            : October 28, 2003
INVENTOR(S)      : Henrik Jensen et al.

It is certified that error appears in the above-identified patent and that said Letters Patent is hereby corrected as shown below:

Column 7, line 60, in Claim 7: replace "threelevel" with --three-level--

Column 8, line 36, in Claim 11: replace "threelevel" with --three-level--

Signed and Sealed this

Twenty-sixth Day of August, 2008

JON W. DUDAS
*Director of the United States Patent and Trademark Office*